(12) United States Patent
Nishida et al.

(10) Patent No.: US 6,566,235 B2
(45) Date of Patent: May 20, 2003

(54) PROCESS FOR PRODUCING SEMICONDUCTOR MEMBER, AND PROCESS FOR PRODUCING SOLAR CELL

(75) Inventors: Shoji Nishida, Hiratsuka (JP); Takao Yonehara, Atsugi (JP); Kiyofumi Sakaguchi, Yokohama (JP); Noritaka Ukiyo, Atsugi (JP); Yukiko Iwasaki, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 28 days.

(21) Appl. No.: 09/819,680

(22) Filed: Mar. 29, 2001

(65) Prior Publication Data

US 2001/0055854 A1 Dec. 27, 2001

(30) Foreign Application Priority Data

Mar. 31, 2000 (JP) ........................................ 2000-099010

(51) Int. Cl.$^7$ .............................................. H01L 21/46
(52) U.S. Cl. ........................................ 438/458; 438/455
(58) Field of Search ........................... 438/57, 455, 459, 438/458

(56) References Cited

U.S. PATENT DOCUMENTS

| | | | | |
|---|---|---|---|---|
| 5,421,958 A | * | 6/1995 | Fathauer et al. | 216/48 |
| 5,529,950 A | * | 6/1996 | Hoenlein et al. | 438/455 |
| 5,810,994 A | * | 9/1998 | Lee et al. | 205/656 |
| 5,856,229 A | | 1/1999 | Sakaguchi et al. | 438/406 |
| 5,970,361 A | | 10/1999 | Kumomi et al. | 438/409 |
| 6,107,213 A | | 8/2000 | Tayanaka | 438/762 |
| 6,221,738 B1 | | 4/2001 | Sakaguchi et al. | 438/455 |
| 6,271,101 B1 | * | 8/2001 | Fukunaga | 438/455 |

FOREIGN PATENT DOCUMENTS

| | | |
|---|---|---|
| JP | 7-302889 | 11/1995 |
| JP | 10-135500 | 5/1998 |

* cited by examiner

Primary Examiner—Caridad Everhart
(74) Attorney, Agent, or Firm—Fitzpatrick, Cella, Harper & Scinto

(57) ABSTRACT

A process for producing a semiconductor member, comprising a first step of forming a porous layer by making porous a first member at its surface portion, leaving some region or regions thereof not made porous; a second step of bonding a semiconductor layer formed on the porous layer and on the first-member surface left not made porous, to a second member to form a bonded structure; and a third step of separating the bonded structure at the part of the porous layer. The first member is made porous leaving some region or regions thereof not made porous so that the porous layer does not cause any separation at the part of the porous layer in the first and second steps.

This process can make the semiconductor layer unseparable from the single-crystal silicon member before the separation for transferring the semiconductor layer to the support member side, without setting the anodizing conditions strictly.

Also disclosed is a process for producing a solar cell by the above process.

15 Claims, 11 Drawing Sheets

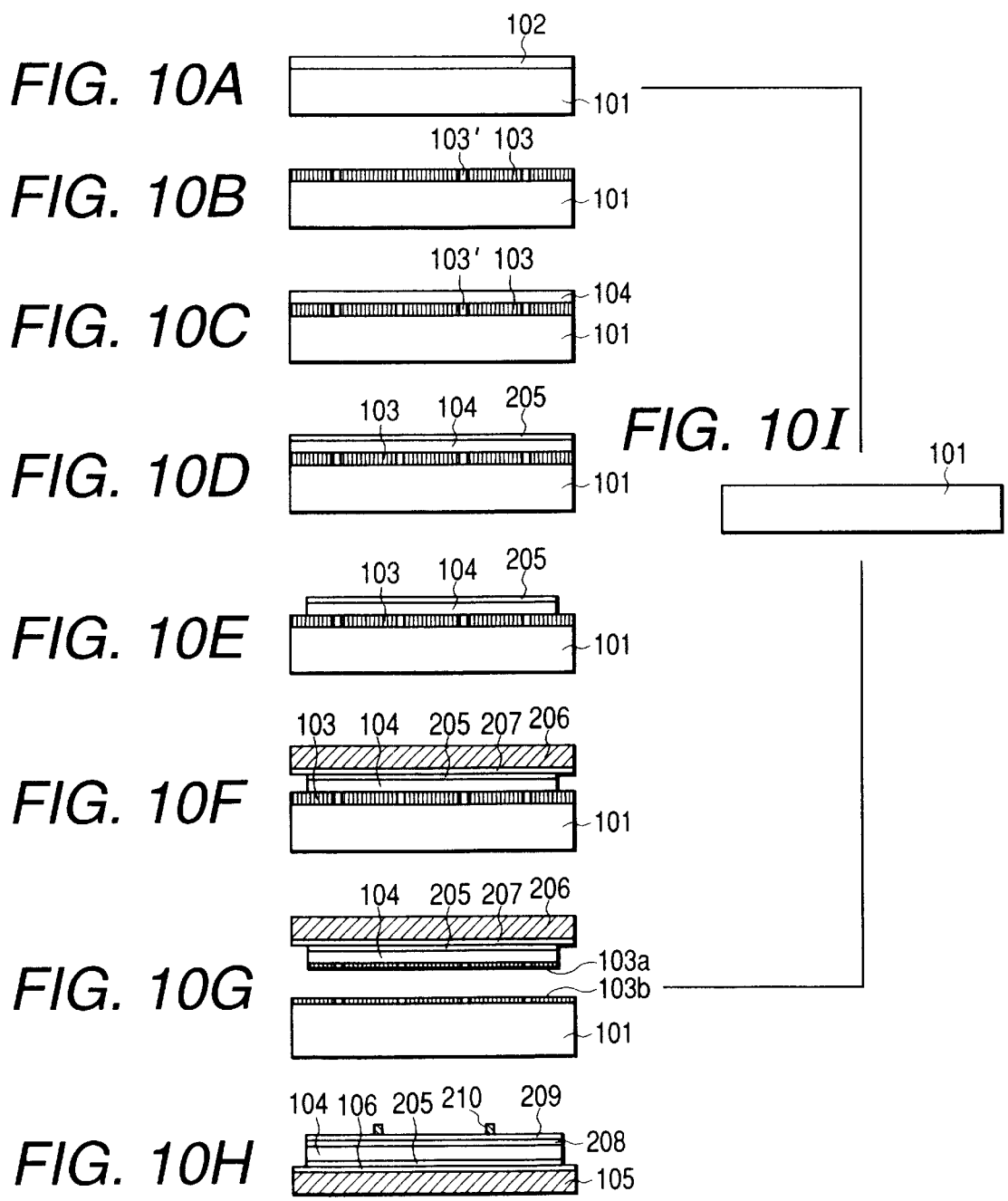

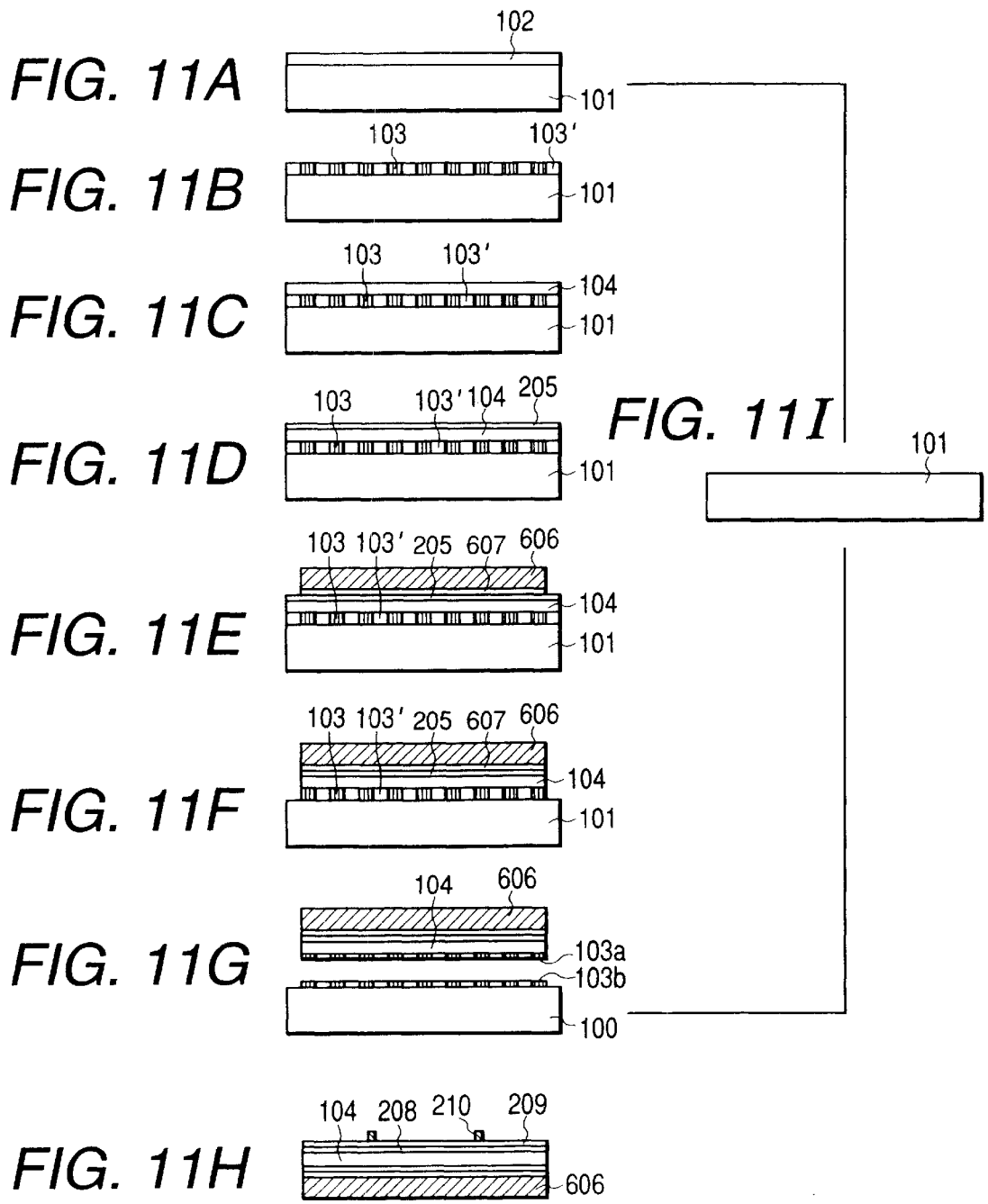

PROCESS FOR PRODUCING SEMICONDUCTOR MEMBER, AND PROCESS FOR PRODUCING SOLAR CELL

BACKGROUND OF THE INVENTION

1. Field of the Invention

This invention relates to a process for producing a semiconductor member and a process for producing a solar cell. More specifically, this invention relates to a process for producing a semiconductor member and a process for producing a solar cell which processes have the step of transferring a semiconductor layer to the part of a second member by making separation in the part of a porous layer.

2. Related Background Art

Studies are widely made on solar cells as a drive energy source of various appliances and a power source for connecting commercial electric power systematically. It is desired for the solar cells that their devices can be formed on inexpensive members because of requirements on cost. However, expensive single-crystal silicon members (wafers) are commonly used as semiconductors which constitute the solar cells.

As a method for making solar cells low-cost, for example Japanese Patent Applications Laid-open No. 7-302889 and No. 10-135500 disclose a method in which a peeled thin-film single-crystal semiconductor layer is used.

According to these publications, a solar cell is conventionally produced in the following way. First a $p^+$-type surface layer is formed at the surface of a single-crystal silicon member 101 (corresponding to 101 in FIG. 1A) and the $p^+$-type surface layer is subjected to anodizing to form a porous layer. Next, a semiconductor layer is formed on the porous layer. Subsequently, for example, a support member on which an adhesive layer has been formed is bonded to the semiconductor layer. Then, the porous layer is broken (i.e., the bonded structure obtained is separated at the porous layer) to transfer the semiconductor layer to the support member side. Then, electrodes and so forth are formed on the support member side to which the semiconductor layer has been transferred.

In such a conventional method, however, the porous layer is formed over the whole surface of the single-crystal silicon member 101, and hence, where the porous layer formed has a low strength, the porous layer itself may unwantedly break before the separation for transferring the semiconductor layer to the support member side. Accordingly, when the porous layer is formed, it has been required to set anodizing conditions strictly so as to prevent such break.

SUMMARY OF THE INVENTION

Accordingly, an object of the present invention is to make the semiconductor layer unseparable from the single-crystal silicon member before the separation for transferring the semiconductor layer to the support member side, without setting the anodizing conditions strictly.

To achieve the above object, the present invention provides a process for producing a semiconductor member, comprising:

a first step of forming a porous layer by making porous a first member prepared or an epitaxial layer formed at the surface of the first member, leaving some region or regions thereof not made porous;

a second step of bonding a semiconductor layer formed on the porous layer and on the first member or epitaxial layer that is left not made porous, to a second member to form a bonded structure; and a third step of separating the bonded structure in the part of the porous layer, at the interface between the porous layer and the first member or at the interface between the porous layer and the semiconductor layer to transfer the semiconductor layer to the second member side, wherein the first member or epitaxial layer is made porous leaving some region or regions thereof not made porous so that the porous layer does not cause any separation in the part of the porous layer, at the interface between the porous layer and the first member or at the interface between the porous layer and the semiconductor layer in the first and second steps.

The present invention also provides a process for producing a solar cell, the process comprising the steps of producing a semiconductor member by the above semiconductor member production process, and providing the semiconductor member with an electrode.

BRIEF DESCRIPTION OF THE DRAWINGS

FIGS. 10A, 10B, 10C, 10D, 10E, 10F, 10G, 10H and 10I illustrate a flow chart of the production of a thin-film crystal solar cell in Embodiment 2 of the present invention.

FIGS. 11A, 11B, 11C, 11D, 11E, 11F, 11G, 11H and 11I illustrate a flow chart of the production of a thin-film crystal solar cell in Embodiment 3 of the present invention.

DETAILED DESCRIPTION OF THE PREFERRED EMBODIMENTS

Figure 1:
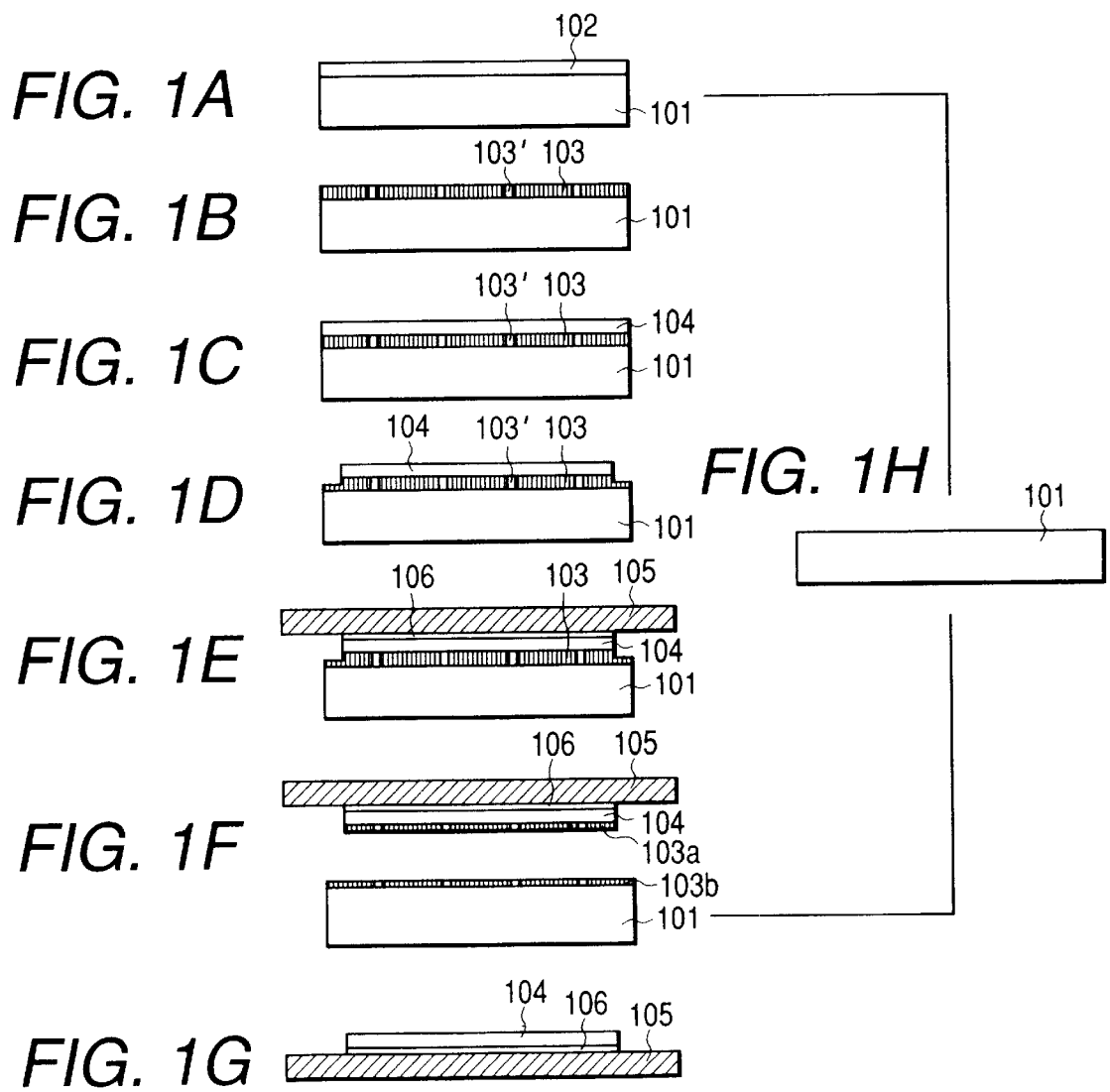
FIGS. 1A, 1B, 1C, 1D, 1E, 1F, 1G and 1H illustrate a flow chart of the production of a semiconductor member in Embodiment 1 of the present invention.

Embodiments of the present invention will be described below in detail with reference to the accompanying drawings.

(Embodiment 1)

FIGS. 1A to 1H illustrate a flow chart of the production of a semiconductor member in Embodiment 1 of the present invention. In FIGS. 1A to 1H, reference numeral 101 denotes a single-crystal silicon member (first member) having any desired shape; 102, a $p^+$-type surface layer 102 formed at the surface of the single-crystal silicon member

101; 103 a porous layer formed by making the p⁺-type surface layer 102 porous; 103', unanodized regions which are regions where the p⁺-type surface layer 102 is left not made porous; 104, a silicon layer having any desired shape, formed on the porous layer 103 and unanodized regions 103'; 105, a support member (second member) to which side the silicon layer 104 is to be (or has been) transferred; and 106, an adhesive layer 106 through which the single-crystal silicon member 101 is bonded to the support member 105.

As the support member 105, materials having a rigidity or a flexibility may be used, including, e.g., silicon wafers, SUS stainless steel sheets, glass sheets, and plastic or resin films. As the resin films, polymeric films may preferably be used, including as typical ones polyimide film, EVA (ethylene vinyl acetate) film and Tefzel.

The adhesive layer 106 may also be formed using a conductive metal paste such as copper paste and silver paste, a mixture of such a conductive metal paste with glass frit, or an epoxy-type adhesive.

In the case where the epoxy-type adhesive is used to form the adhesive layer 106, the epoxy-type adhesive may be inserted between the support member 105 and the silicon layer 104, which are then brought into close contact, followed by baking to effect firm bond. In this case, the metal such as copper or silver having been baked also functions as a back electrode and a back reflection layer. Also, in the case where the support member 105 is formed of the polymeric film, the support member 105 and the silicon layer 104 may be brought into close contact and in this state (here, a back electrode (not shown) is previously formed on the surface of the silicon layer 104) the support member 105 is heated to its softening point to bond the both firmly.

A process for producing a semiconductor member according to the present Embodiment is described below. First, into the surface portion of the single-crystal silicon member 101, impurities such as B (boron) are introduced by thermal diffusion or ion implantation or are incorporated when the wafer is produced. Thus, the p⁺-type surface layer 102 is formed (FIG. 1A).

Next, in the state an anti-porous member (not shown; described later) is attached to part of the p⁺-type surface layer 102, the single-crystal silicon member 101 is subjected to anodizing in, e.g., an aqueous HF (hydrogen fluoride) solution by means of an anodizing apparatus shown in FIGS. 5 and 6 as described later, to make part of the p⁺-type surface layer 102 porous to form the porous layer 103 and unanodized regions 103' (FIG. 1B).

The layer may be made porous in such a way that the anodizing is carried out first at a level of low electric current for a certain time, and thereafter at a level abruptly raised to high electric current and for a short time. This makes it possible to previously provide the porous layer 103 with an internal structural change in density, whereby the silicon layer 104 can be separated from the part of the single-crystal silicon member 101 with ease as detailed later.

Next, on the porous layer 103 and unanodized regions 103', the silicon layer 104 is formed by epitaxial growth as exemplified by thermal CVD (chemical vapor deposition), LPCVD (low-pressure CVD), sputtering, plasma-assisted CVD or photo-assisted CVD, and liquid-phase epitaxy. Incidentally, at the time the silicon layer 104 is formed here, a dopant may be introduced in a trace quantity to control the silicon layer to be of a p⁻-type (or n⁻-type).

As material gases used in the case where the silicon layer 104 is formed by gas-phase epitaxy in the step shown as FIG. 1C, they may typically include silanes and halogenated silanes, such as $SiH_2Cl_2$, $SiCl_4$, $SiHCl_3$, $SiH_4$, $Si_2H_6$, $SiH_2F_2$ and $Si_2F_6$.

In addition to the above material gases, hydrogen ($H_2$) may be added as a carrier gas or for the purpose of providing a reducing atmosphere to accelerate crystal growth. The proportion of the material gases and hydrogen may appropriately be determined in accordance with the methods of formation, the types of material gases and also the conditions for formation. It may suitably be from 1:10 to 1:1,000 (feed flow rate ratio), and more preferably from 1:20 to 1:800.

In contrast, in the case where the silicon layer 104 is formed by liquid-phase epitaxy in the step shown as FIG. 1C, silicon may be dissolved in a solvent such as Ga, In, Sb, Bi or Sn to effect epitaxial growth in an atmosphere of $H_2$ or $N_2$ while cooling the solvent gradually or providing a temperature difference in the solvent.

As for temperature and pressure in the epitaxial growth process, they may differ depending on the methods of formation and the types of materials (gases) used. With regard to the temperature, it may suitably be from 800° C. to 1,250° C. in approximation when silicon is grown by usual thermal CVD, and may more preferably be controlled to from 850° C. to 1,200° C. In the case of the liquid-phase epitaxy, the temperature depends on the types of the solvent, and may preferably be controlled to from 600° C. to 1,050° C. when silicon is grown using Sn or In as the solvent. In low-temperature processes such as plasma-assisted CVD, it may suitably be from 200° C. to 600° C. in approximation, and may more preferably be controlled to from 200° C. to 500° C.

Similarly, with regard to the pressure, it may suitably be from $10^{-2}$ Torr to 760 Torr in approximation, and more preferably be within the range of from $10^{-1}$ Torr to 760 Torr.

Figure 7:
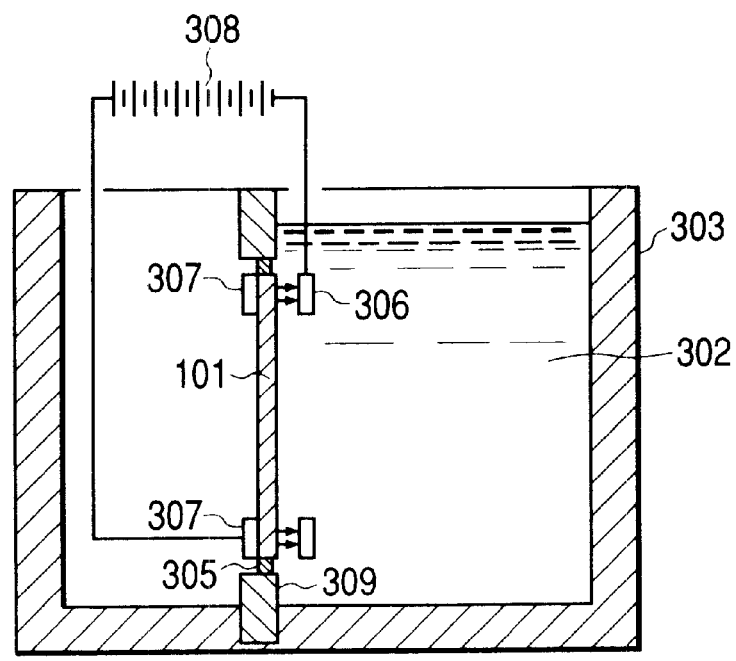
FIG. 7 illustrates the construction of an anodizing apparatus for removing the peripheral portion of a silicon layer and optionally porous layer in the step shown in FIG. 1D.
Figure 8:
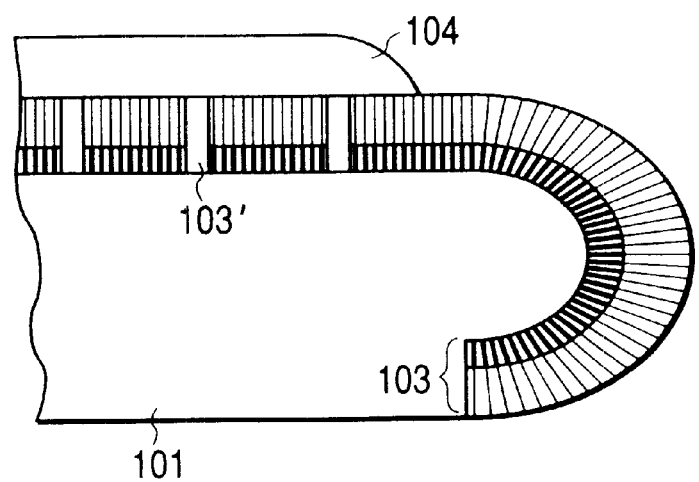
FIG. 8 is an enlarged view of the peripheral edge portion of a single-crystal silicon member.

FIG. 8 is an enlarged view of the peripheral edge portion of the single-crystal silicon member 101. In the case where as shown in FIG. 8 the silicon layer 104 does not completely cover the porous layer 103 and the porous layer 103 is uncovered at the peripheral surface of the single-crystal silicon member 101, part or the whole of the porous layer 103 at its uncovered portion is removed by means of, e.g., an anodizing apparatus shown in FIG. 7 (FIG. 1D). This is to make it easy to separate the silicon layer 104 from the single-crystal silicon member 101.

In the step shown in FIG. 1D, the peripheral portion of any of i) only the silicon layer 104, ii) the silicon layer 104 and part of the porous layer 103 and iii) the silicon layer 104 and the whole porous layer 103 may be removed, depending on the porous layer 103's separation strength governed by the exclusive area of unanodized regions 103'.

Subsequently, an oxide film which is the adhesive layer 106 is formed on the surface of the support member 105, and the silicon layer 104 is bonded to the oxide film, where these are put in a heat-treating furnace (not shown) to bring the support member 105 and the single-crystal silicon member 101 into firm bond (FIG. 1E).

Next, force is made to act between the support member 105 and the single-crystal silicon member 101 in the direction where they are pulled apart from each other, to separate them at the part of the porous layer 103 (FIG. 1F). Here, to separate the silicon layer 104 from the single-crystal silicon member 101, a mechanical external force may be made to act directly between these members to make separation at the part of the porous layer 103. Alternatively, force (internal stress) existing in the silicon layer 104 and the porous layer 103 or between these and the single-crystal silicon member 101, or energy such as heat, ultrasonic waves, electromagnetic waves or centrifugal force applied externally may be utilized and made to act indirectly on a brittle portion in the porous layer 103.

Then, a porous layer 103a remaining on the silicon layer 104 peeled from the single-crystal silicon member 101 and a porous layer 103b remaining on the single-crystal silicon member 101 are selectively removed by the use of at least one of a usual silicon etchant, porous-silicon selective-etchant hydrofluoric acid, a mixed solution prepared by adding at least one of an alcohol and hydrogen peroxide water to hydrofluoric acid, buffered hydrofluoric acid, a mixed solution prepared by adding at least one of an alcohol and hydrogen peroxide water to buffered hydrofluoric acid, and an alkali solution of KOH, NaOH, hydrazine or tetramethyl ammonium (FIG. 1C).

The support member 105 to which the silicon layer 104 has been transferred may be used as a semiconductor member as it is, or, as occasion calls, the silicon layer may again be transferred to a third member suited for products.

Thereafter, where the surface is too rough for its flatness to be tolerable, the single-crystal silicon member 101 may optionally be surface-smoothed (FIG. 1H), and thereafter it is reused in the step of FIG. 1A.

Figure 2:
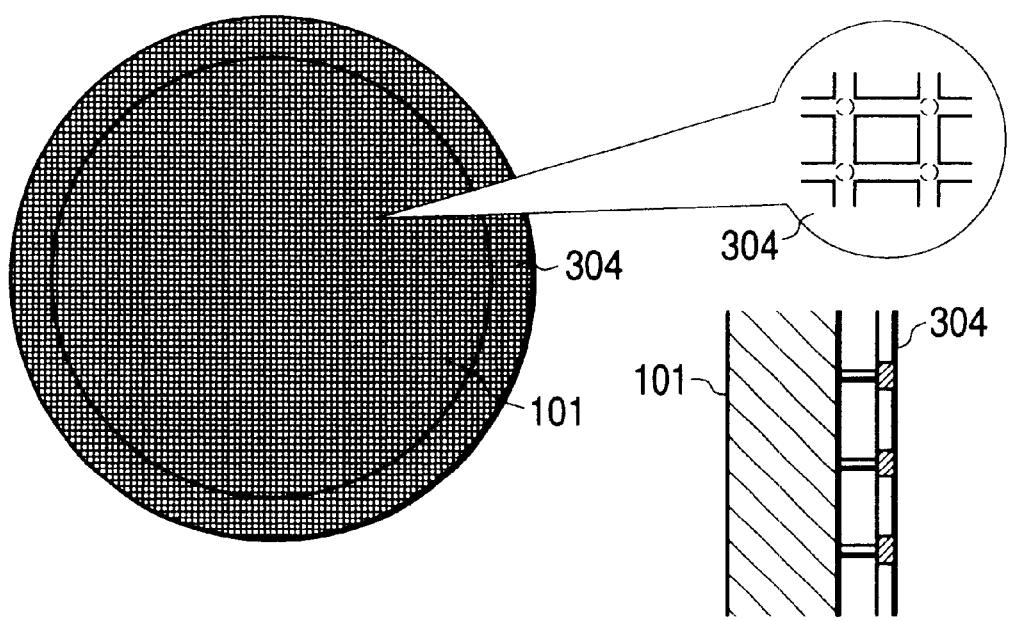
FIG. 2 illustrates an external appearance of an anti-porous member for forming unanodized regions, together with its partially enlarged view and partially enlarged cross section.

FIG. 2 illustrates an external appearance of an anti-porous (herein meant to be "preventing a part of the surface layer 102 from being made porous by anodizing") member 304 for forming the unanodized regions 103', together with its partially enlarged view and partially enlarged cross section. The anti-porous member 304 shown in FIG. 2 is an anti-porous mask comprising, e.g., Teflon resin made up in a lattice, and pins comprised of Teflon resin which have been joined to individual cross points of the lattice. In the state the pins of this anti-porous member 304 are kept in contact with the surface of the $p^+$-type surface layer 102, the layer is anodized through the lattice openings by means of an anodizing apparatus described later. Thus, of the $p^+$-type surface layer 102, the part where the pins stand in contact with its surface forms the unanodized regions 103' so that it is not anodized (i.e., not made porous).

Figure 3A:
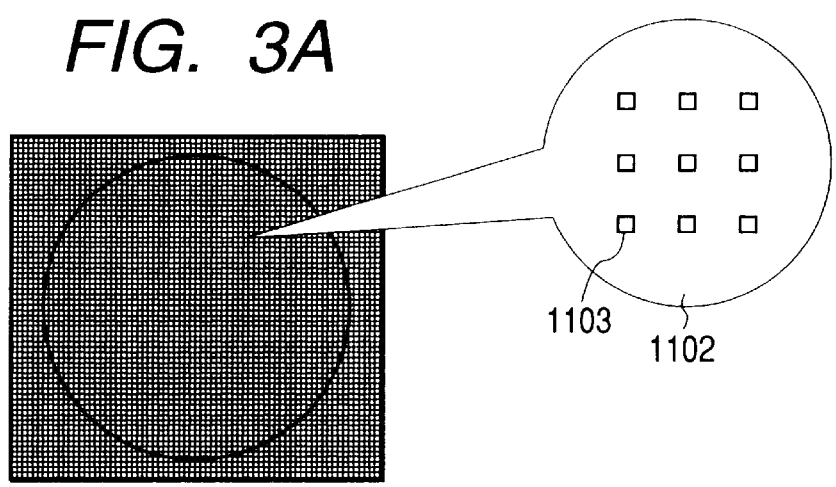
FIGS. 3A, 3B, 3C and 3D illustrate an external appearance of a mask for forming the anti-porous member.
Figure 3B:
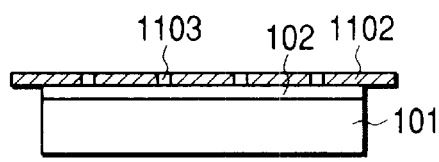
Figure 3C:
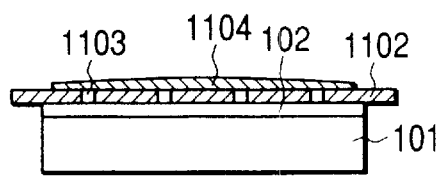
Figure 4A:
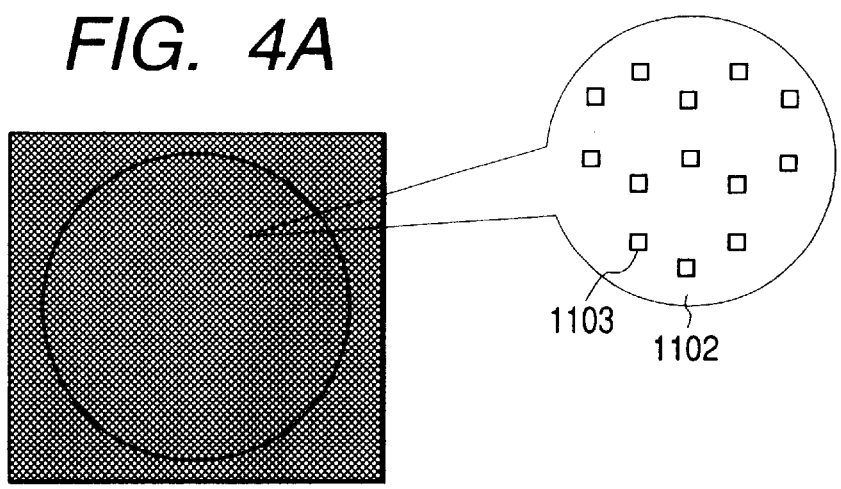
FIGS. 4A, 4B, 4C and 4D illustrate an external appearance of another mask for forming the anti-porous member.
Figure 4B:
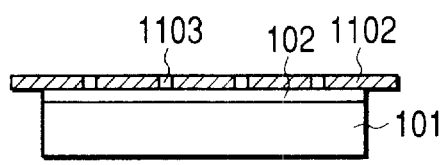
Figure 4C:
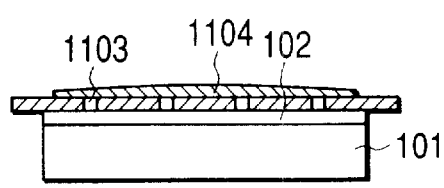

In place of such an anti-porous member provided integrally with the lattice portion as described above, the anti-porous member may also be formed in the following way. FIGS. 3A and 4A each illustrate an external appearance of a mask 1102 for forming the anti-porous member by means of which the $p^+$-type surface layer 102 is partly not made porous. The mask 1102 shown in each of FIGS. 3A and 4A has openings 1103. In the state where as shown in FIGS. 3B and 4B the mask 1102 is placed on the single-crystal silicon member 101 having the $p^+$-type surface layer 102 formed thereon, an epoxy resin, a fluorine resin or a wax 1104 or the like liquefied by heating, serving as an anti-porous material, is coated over the mask 1102 as shown in FIGS. 3C and 4C.

Figure 3D:
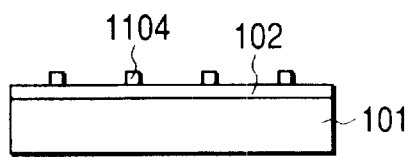
Figure 4D:
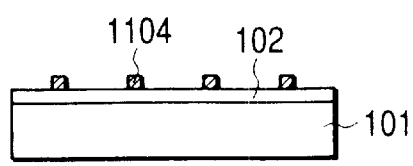

Then, after the wax 1104 has cooled to solidify, the wax 1104 remaining on the mask 1102 is removed by etching or the like, and thereafter the mask 1102 is removed from the $p^+$-type surface layer 102. Thus, as shown in FIGS. 3D and 4D, an anti-porous member formed of the wax 1104 having solidified at the part corresponding to the openings 1103 is formed on the $p^+$-type surface layer 102. The single-crystal silicon member 101 thus treated may be anodized, whereupon the unanodized regions 103' are formed because the part where the wax 1104 remains functions as the anti-porous member and is not anodized.

The pins of the anti-porous member 304 shown in FIG. 2 and the openings 1103 of the mask 1102 shown in each of FIGS. 3A and 4A may be in any arrangement such as circular arrangement, elliptic arrangement, rectangular arrangement or polygonal arrangement without any particular limitations. Also, taking account of an instance where the anodizing is carried out using, e.g., hydrofluoric acid as described later, the anti-porous member 304 and the mask 1102 may preferably be formed using materials having resistance to hydrofluoric acid, such as fluorine resin, carbon and SiC.

In this connection, the area of the part where each pin of the anti-porous member 304 shown in FIG. 2 comes into contact with the $p^+$-type surface layer 102, the interval between individual pins, and the area of each opening 1103 and interval between individual openings 1103 of the mask 1102 shown in FIGS. 3A and 4A are appropriately determined balancing the step of separation and the peel strength evenly. In an instance where a force of, e.g., 50 kgf/cm$^2$ is applied to the silicon layer 104 when the silicon layer 104 is separated from the single-crystal silicon member 101, the area of the part where each pin comes into contact with the $p^+$-type surface layer 102 and the area of each opening 1103 may be, e.g., 5 μm and the interval of individual pins and the distance between individual openings 1103 may be, e.g., 1.8 mm.

Figure 5:
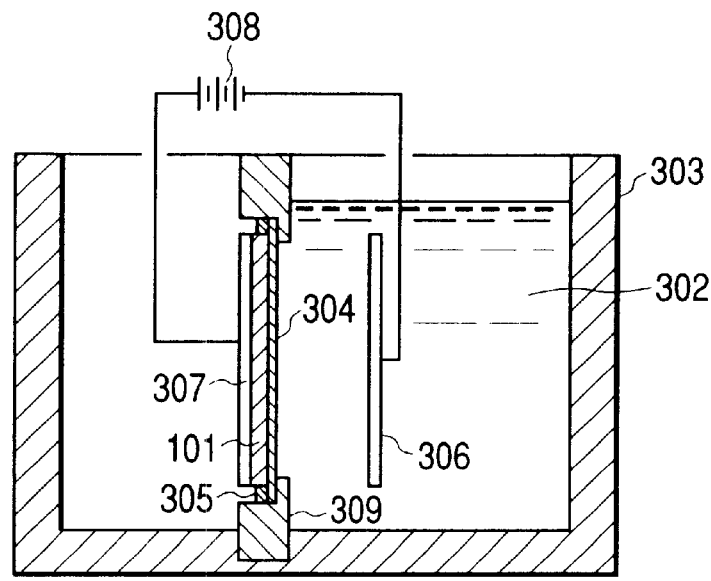
FIG. 5 illustrates the construction of an anodizing apparatus for carrying out anodization in the step shown in FIG. 1B.
Figure 6:
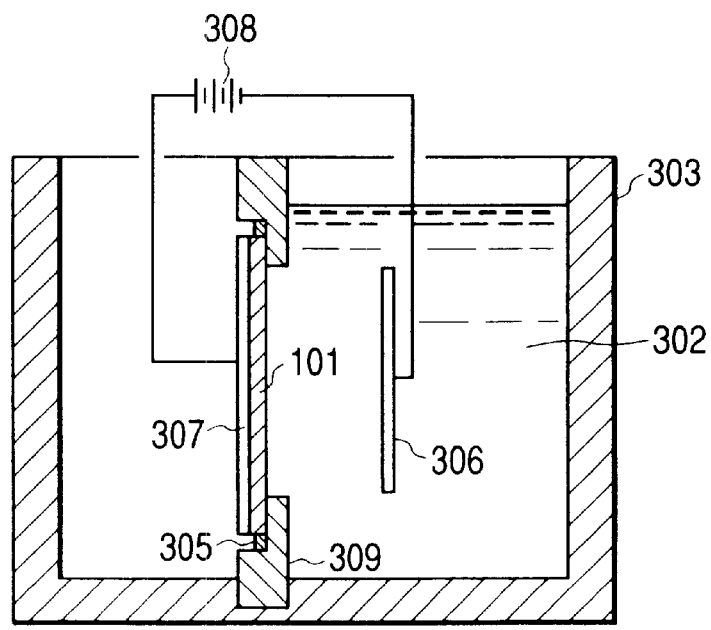
FIG. 6 illustrates the construction of an anodizing apparatus according to Embodiment 3, having a masking member (as an anti-porous member) that covers the peripheral portion (boundary area) of a wafer.

FIG. 5 illustrates the construction of an anodizing apparatus for carrying out anodization in the step shown in FIG. 1B. FIG. 7 illustrates the construction of an anodizing apparatus for removing the peripheral portion of the silicon layer and optionally porous layer in the step shown in FIG. 1D. As shown in FIG. 5, a single-crystal silicon member 101 to which the anti-porous member 304 has been attached is held on a member holder 309 through a sealing material 305.

Then, when the anodizing in the step shown in FIG. 1B is carried out, an anodizing solution 302 as exemplified by an aqueous HF solution to which an alcohol such as ethyl alcohol has been added and having an HF concentration of, e.g., 10% or more is put in an anodizing bath 303 on its anti-porous member 304 side, and an electric current of several mA/cm$^2$ to tens of mA/cm$^2$ is applied from a power source 308 to a positive electrode 307 and a negative electrode 306 to form the porous layer 103 as shown in FIG. 5.

Meanwhile, when the anodizing in the step shown in FIG. 1D is carried out, the silicon layer 104 is etched with an aqueous HF solution having an HF concentration of 20% or less. The hydrofluoric acid may be diluted with an alcohol (such as ethyl alcohol) or water or other electrical-conductivity-providing agent such as an acid or a salt thereof. Here, an electric current of approximately from 10 mA/cm$^2$ to 100 mA/cm$^2$ is applied from the power source 308 to the positive electrode 307 and negative electrode 306 to form the porous layer 103 as shown in FIG. 7. Thus, the silicon layer 104 or the silicon layer 104 and part or the whole of the porous layer 103 is/are removed at its/their peripheral portion.

There are no particular limitations on materials for the positive electrode 307, whereas materials for the negative electrode 306 may preferably be those which can withstand the acidic, anodizing solution 302. What is used here is, e.g., platinum. Also, the quantity of electric current flowed to the positive electrode 307 and negative electrode 306 may appropriately be determined in accordance with the HF concentration, the intended layer thickness of the porous silicon layer and the state of porous layer surface.

The aqueous HF solution to which an alcohol such as ethyl alcohol has been added and having an HF concentration of, e.g., 10% or more is used as the anodizing solution 302 in order that any bubbles of reaction product gases generated at the time of anodizing can instantaneously be removed from the reaction liquid surface without stirring and the porous silicon can be formed uniformly and in a good efficiency. The quantity of the alcohol to be added may appropriately be determined in accordance with the HF concentration, the intended layer thickness of the porous silicon layer and the state of porous layer surface. In the present Embodiment, the HF concentration is controlled to 10% or more so as not to make the HF concentration too low.

Figure 9A:
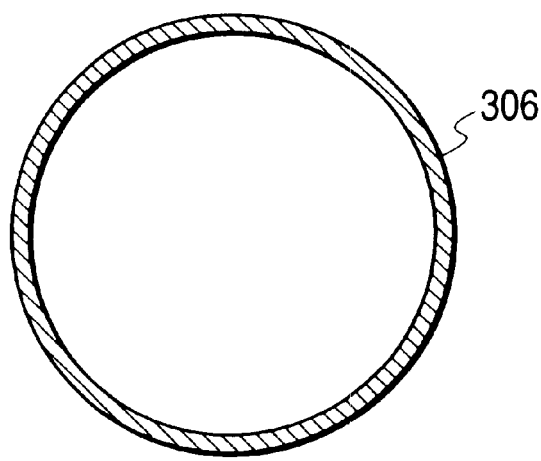
FIGS. 9A, 9B and 9C are plan views of negative electrodes usable in the anodizing apparatus shown in FIG. 7.
Figure 9B:
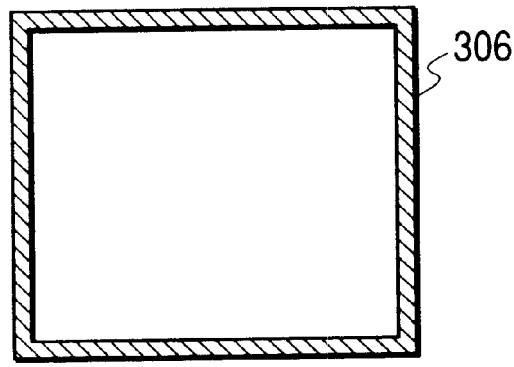
Figure 9C:
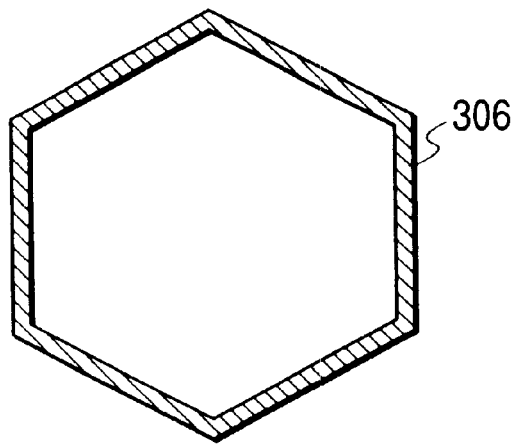

FIGS. 9A to 9C are plan views showing the shapes of the negative electrode 306 and positive electrode 307 of the anodizing apparatus shown in FIG. 7. FIG. 9A shows a negative electrode 306 having the shape of a beltlike ring in a size extending along the peripheral portion of the single-crystal silicon member 101; and FIGS. 9B and 9C, a negative electrode 306 having the shape of a polygon.

The shape and so forth of the negative electrode 306 and positive electrode 307 may be changed after the shape of any single-crystal silicon member 101 to be produced. Use of the negative electrode 306 and positive electrode 307 shown in FIG. 9C enables separation of a square silicon layer 104 from a circular single-crystal silicon member 101. Hence, this is preferable when solar cells are produced.

Since in the present Embodiment the single-crystal silicon member 101 is anodized in the state the anti-porous member is provided as described above, part of the p$^+$-type surface layer 102 is not made porous. This enables prevention of the porous layer 103 from breaking until the silicon layer 104 is peeled and transferred to the support member 105 side.

(Embodiment 2)

FIGS. 10A to 10I illustrate a flow chart of the production of a thin-film crystal solar cell in Embodiment 2 of the present invention. In FIGS. 10A to 10I, reference numeral 205 denotes a p$^+$-type layer; 206, a polymeric film member which is a support member; 207, a back electrode; 208, an n$^+$-type layer; 209, a transparent conductive film formed of ITO (indium-tin oxide) or the like, serving also as a surface anti-reflection layer; and 210, a grid-type collector electrode. In FIGS. 10A to 10I, the same parts as those in FIGS. 1A to 1H are denoted by the like reference numerals.

First, in the same manner as the steps shown in FIGS. 1A to 1C, the p$^+$-type surface layer 102 is formed at the surface of the single-crystal silicon member 101, and part of this surface layer is made porous by means of, e.g., the anodizing apparatus shown in FIG. 5, to form the porous layer 103. Next, on the porous layer 103 and unanodized regions 103' left not made porous, the silicon layer 104 is formed by epitaxial growth made by, e.g., thermal CVD (FIG. 10A to 10C).

Here, at the time the silicon layer 104 is formed, a dopant may be introduced in a trace quantity to control the silicon layer to be of a p$^-$-type (or n$^-$-type). On the silicon layer 104, the p$^+$-type layer (or n$^+$-type layer) 205 is deposited by plasma-assisted CVD or by increasing the dopant when the formation of the silicon layer 104 is finished (FIG. 10D).

In the case where the porous layer 103 stands uncovered at the peripheral surface of the single-crystal silicon member 101, part or the whole of the porous layer 103 is removed at its uncovered portion by means of the anodizing apparatus shown in FIG. 7. Also when the porous layer 103 does not stand uncovered at the surface, silicon layers 104 and 205 and/or part or the whole of the porous layer 103 may be removed (FIG. 10E).

Subsequently, a polymeric-film member 206 on which a copper paste has been printed as a back electrode 207 is bonded in close contact with the single-crystal silicon member 101 on its side where the silicon layer 104 and p$^+$-type layer 205 have been formed, and these are put in an oven (not shown) and heated to bring the polymeric-film member 206 and the single-crystal silicon member 101 into firm bond, holding the layers 103, 104, 205 and 207 between them (FIG. 10F).

Next, force is made to act between the polymeric-film member 206 and the single-crystal silicon member 101 in the direction where they are pulled apart from each other. That is, the flexibility of the polymeric film is utilized and the both are slowly drawn off from the edge of the single-crystal silicon member 101 to separate them at the part of the porous layer 103 (FIG. 10G). Incidentally, like Embodiment 1, heat may be applied externally and made to act indirectly on a brittle portion in the porous layer 103.

A porous layer 103a remaining on the silicon layer 104 separated from the single-crystal silicon member 101 is selectively removed in the same manner as in Embodiment 1. On the surface of the silicon layer 104 from which the porous layer 103 has been removed, an n$^+$-type layer 208 is formed. Thus, a semiconductor junction consisting of the p$^+$-type layer 205 and the n$^+$-type layer 208 is formed. These layers function as a photoelectric conversion layer. Further thereon a transparent conductive film of ITO or the like, serving also as a surface anti-reflection layer, and a grid-type collector electrode 210 are formed by vacuum deposition to make up a solar cell (FIG. 10H).

Incidentally, the surface of the silicon layer 104 may preferably be subjected to texture treatment in order to make incident light less reflect in the solar cell. In the case of silicon, the treatment may be made using hydrazine, NaOH or KOH. The height of pyramids of the texture formed may suitably be within the range of from several microns to tens of microns.

The single-crystal silicon member 101 after separation may be treated in the same manner for the porous layer 103a to remove a porous layer 103b remaining on its surface. Where the surface is too rough for its flatness to be tolerable, the single-crystal silicon member 101 may optionally be surface-smoothed (FIG. 10I), and thereafter it is reused in the step of FIG. 10A.

(Embodiment 3)

FIGS. 11A to 11I illustrate a flow chart of the production of a thin-film crystal solar cell in Embodiment 3 of the present invention. In the present Embodiment, what is differ from Embodiment 2 is that the peripheral portion of the single-crystal silicon member 101 is not anodized. Also, in FIGS. 11A to 11I, reference numeral 606 denotes a metallic member which is a support member. In FIGS. 11A to 10I, the same parts as those in FIGS. 10A to 10I are denoted by the like reference numerals.

First, in the same manner as the step shown in FIG. 10A, the p$^+$-type surface layer 102 is formed at the surface of the single-crystal silicon member 101. Then, the part other than the peripheral portion of the single-crystal silicon member 101 is made porous by means of the anodizing apparatus shown in FIG. 5, in the state the single-crystal silicon member 101 is provided with the anti-porous member 304 formed, e.g., in the manner shown in FIGS. 4A to 4D to form the porous layer 103 (FIG. 11B). Next, on the porous layer 103 and unanodized regions 103' left not made porous, the silicon layer 104 is formed by, e.g., thermal CVD (FIG. 11C).

Figure 12:
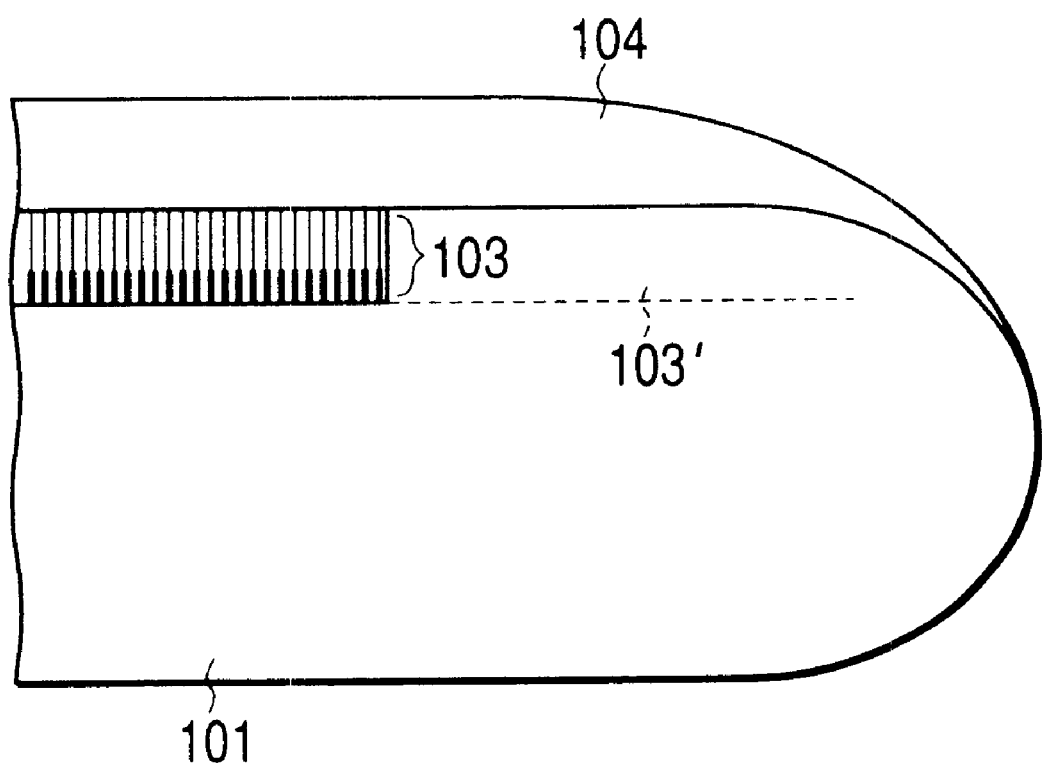
FIG. 12 illustrates how a porous layer stands covered thereon with a silicon layer.

Here, the peripheral portion of the single-crystal silicon member 101 stands, e.g., as shown in FIG. 12, and the level of a high electric current at the time of anodizing is relatively so large that part or the whole of the porous layer 103 may break in its interior, at the interface between the porous layer 103 and the single-crystal silicon member 101 or at the interface between the porous layer 103 and the silicon layer 104 in the course of, e.g., the thermal CVD or the steps subsequent thereto. Even in such a case, since the silicon layer 104 is supported at the part of the unanodized regions 103', the silicon layer 104 by no means becomes separated from the single-crystal silicon member 101 as long as all the unanodized regions 103' are not broken or removed.

In the anodizing apparatus, there are no particular limitations on the distance between the single-crystal silicon member 101 and the negative electrode 306. With regard to the distance between the single-crystal silicon member 101 and the positive electrode 307, however, the positive electrode 307 may preferably be provided at a position near to the single-crystal silicon member 101 because a relatively high electric current is flowed across them. In the present Embodiment, the positive electrode 307 is set in contact with the single-crystal silicon member 101.

This means on the other hand that the porous layer 103 may also be formed under conditions such that the porous layer 103 is intentionally completely separated at the time of thermal CVD or at the step subsequent thereto. In such a case, the silicon layer 104 can smoothly be separated at the point of time where the unanodized regions 103' are broken to removed. At the time the silicon layer 104 is formed, a dopant may be introduced in a trace quantity to control the silicon layer to be of a p$^-$-type (or n$^-$-type).

Then, in the same manner as that for the step shown in FIG. 10D, the p$^+$-type layer 205 for example is formed (FIG. 11D). Next, the metallic member 606 which is a support member on which a copper paste which is a metal paste 607 has been printed in a size smaller than the single-crystal silicon member 101 is bonded in close contact with the silicon layer 104 on the single-crystal silicon member 101, and these are put in an oven (not shown) and heated to bring the polymeric-film member 206 and the single-crystal silicon substrate 101 into firm bond, holding the layers 103, 104, 205 and so forth between them (FIG. 11E).

Next, using the metallic member 606 as a mask, the silicon layer 104, p$^+$-type layer 205 and unanodized regions 103' on the single-crystal silicon member 101 are removed by dry etching such as reactive-ion etching, by wet etching making use of a hydrofluoric acid type etchant, by a mechanical method such as abrasion or polishing or by means of a laser, to make the edge face of the porous layer 103 uncovered (FIG. 11F).

Next, the metallic member 606 and single-crystal silicon member 101 thus bonded (through the layers 103, 104 and so forth) are put in a water bath and ultrasonic waves are applied thereto. Thus, the silicon layer 104 is separated from the single-crystal silicon member 101 at the part of the porous layer 103 (FIG. 11G). A porous layer 103a remaining on the silicon layer 104 separated from the single-crystal silicon member 101 is selectively removed in the same manner as in Embodiment 2.

On the surface of the silicon layer 104 from which the porous layer 103 has been removed, a p$^+$-type (or n$^+$-type) layer 208 is formed. Thus, a semiconductor junction layer which functions as a photoelectric conversion layer is formed. Further thereon a transparent conductive film 209 of ITO or the like, serving also as a surface anti-reflection layer, and a grid-type collector electrode 210 are formed by vacuum deposition to make up a solar cell (FIG. 11H).

The single-crystal silicon member 101 after separation may be treated in the same manner for the porous layer 103a to remove a porous layer 103b remaining on its surface. Where the surface is too rough for its flatness to be tolerable, the single-crystal silicon member 101 may optionally be surface-smoothed (FIG. 11I), and thereafter it is reused in the step of FIG. 11A.

As described above, according to Embodiments 1 to 3 of the present invention, the unanodized regions 103' have been formed in preset size and shape in the porous layer 103 and hence the silicon layer 104 can be made not to separate from the single-crystal silicon member 101 before the separation for transferring the silicon layer 104 to the support member 105 side.

The semiconductor member and solar cell are described below in greater detail with reference to the accompanying drawings, by giving specific examples of their production processes.

EXAMPLE 1

A process for producing a semiconductor member of Example 1 is described here with reference to FIGS. 1A to 1H.

First, into the surface layer of a single-crystal silicon member 101 of, e.g., 5 inches diameter, boron (B) was thermally diffused using BCl$_3$ as a thermal diffusion source at a temperature of about 1,200° C. to form a p$^+$-type surface layer 102 of about 3 μm thick (FIG. 1A).

In the state the single-crystal silicon member 101 is provided with the anti-porous member 304 shown in FIG. 2, the p$^+$-type surface layer 102 was subjected to anodizing by means of the anodizing apparatus shown in FIG. 5, using as the anodizing solution 302 an aqueous HF/C$_2$H$_5$OH solution and under conditions shown in Table 1 below. Thus, a porous layer 103 having unanodized regions 103' was formed at the surface of the single-crystal silicon member 101 (FIG. 1B).

Here, in order to form the unanodized regions 103', the anti-porous member 304 shown in FIG. 2 was attached onto the single-crystal silicon member 101. The pins of the anti-porous member 304 were each in the form of a square column of, e.g., 80 μm in each side length and were set at intervals of, e.g., 2.8 mm. In the anti-porous member 304 set under such conditions, the force the individual unanodized regions 103' received at the time of separation was 5 kgf/cm$^2$.

Incidentally, the unanodized regions 103' may be so set that their size and intervals have a certain degree of freedom. For example, when the pins of the anti-porous member 304 were each 40 μm in each side length, the pins may be set at intervals of, e.g., 1.4 mm.

Then, the single-crystal silicon member 101 to which the anti-porous member 304 was attached was set in the anodizing apparatus shown in FIG. 5, and a voltage was applied from the power source to the single-crystal silicon member 101 through the positive electrode 307 and negative electrode 306. This anodization does not proceed at the part where the pins stand in contact with the surface layer of the single-crystal silicon member 101, and hence that part is formed as the unanodized regions 103'.

The above anodizing was carried out, e.g., first at a low electric current of 8 mA/cm$^2$ for about 10 minutes and thereafter the level of electric current was slowly so raised on as to reach 38 mA/cm$^2$ in 30 seconds, at that point of time of which the anodizing was stopped.

TABLE 1

| | |
|---|---|
| Anodizing solution: | HF:H$_2$O:C$_2$H$_5$OH = 1:1:1 |
| Current density: | 8 mA/cm$^2$ → 38 mA/cm$^2$ |
| Anodizing time: | 2.5 min. → (30 sec.) → 0 sec. |

In this way, the porous layer was provided with an internal structural change in density, and hence this made it easy to separate the silicon layer 104 from the single-crystal silicon member 101.

Next, on the porous layer 103 and unanodized regions 103' thus formed, a silicon layer 104 was formed in a thickness of, e.g., 0.5 μm by thermal CVD (FIG. 1C). Here, the peripheral portion of the single-crystal silicon member 101 was in such a state that the silicon layer 104 covered the top of the porous layer 103 like a case shown in FIG. 12.

Accordingly, the single-crystal silicon member 101 with porous layer was set in the anodizing apparatus shown in FIG. 7, at its prescribed position to carry out etching in an electropolishing mode, using the positive electrode 307 and negative electrode 306 each having the shape of a beltlike ring shown in FIG. 9A. In this etching, an electric current was flowed across the positive electrode 307 and the negative electrode 306 in an aqueous HF/H$_2$O solution (HF:C$_2$H$_5$OH:H$_2$O=1:1:6). As a result of this treatment, the silicon layer 104 and part of the porous layer 103 lying on the peripheral portion of the single-crystal silicon member 101, were removed in a depth of above 10.5 μm in total (FIG. 1D).

Subsequently, on the surface of the silicon layer 104, an oxide film serving as an adhesive layer 106 was formed in a thickness of about 0.1 μm by means of a normal-pressure CVD system in an environment of, e.g., 450° C. Thereafter, a glass substrate serving as a support member 105 was bonded to the oxide film serving as the adhesive layer 106, and these were put in a heat-treating furnace (not shown) and heated at, e.g., 850° C. to bring the glass substrate and the single-crystal silicon member 101 into firm bond, holding the layers 103 and 104 between them (FIG. 1E).

Next, a force of e.g., 5.1 kg/cm$^2$ was made to act between the glass substrate and the single-crystal silicon member 101 in the direction where they were pulled apart from each other, to separate them at the part of the porous layer 103 (FIG. 1F). Then, a porous layer 103a remaining on the silicon layer 104 separated from the single-crystal silicon member 101 (silicon wafer) was selectively removed with a solution of HF/H$_2$O mixture. Thus, a semiconductor (SOI: silicon on insulator) member was obtained (FIG. 1G).

A porous layer 103b remaining on the single-crystal silicon member 101 after separation was also selectively removed with a solution of HF/H$_2$O mixture. Here, the surface was too rough for its flatness to be tolerable at some part. Accordingly, the surface was smoothed by polishing (FIG. 1H). Using the single-crystal silicon member 101 thus regenerated, the above steps were repeated to obtain a plurality of semiconductor (SOI) members having high-quality silicon layers 104.

For comparison, semiconductor members were produced through the same steps as the above except that the unanodized regions 103' were not formed in the step shown in FIG. 1B. As a result, the yield in the step shown in FIG. 1D was 50% or less. On the other hand, according to the production process of the present Example, semiconductor members were obtainable in an yield of 80% or more.

EXAMPLE 2

A process for producing a solar cell of Example 2 is described here with reference to FIGS. 10A to 10I.

First, into the surface layer of a single-crystal silicon member 101 of, e.g., 5 inches diameter, boron (B) was thermally diffused using BCl$_3$ as a thermal diffusion source at a temperature of about 1,200° C. to form a p$^+$-type surface layer 102 of about 3 μm thick (FIG. 10A).

Next, in the state the single-crystal silicon member 101 was provided with the anti-porous member 304 formed in the manner shown in FIGS. 3A to 3D, the p$^+$-type surface layer 102 was subjected to anodizing by means of the anodizing apparatus shown in FIG. 5, under conditions shown in Table 2 below. Here, an aqueous HF/C$_2$H$_5$OH solution was used as the anodizing solution 302. Thus, a porous layer 103 having unanodized regions 103' was formed at the surface of the single-crystal silicon member 101 (FIG. 10B).

Here, in the mask 1102 (FIG. 3A), the openings 1103 were so formed that the wax 1104 was provided in the form of a square column of, e.g., 30 μm in each side length and the square columns of the wax 1104 were set at intervals of, e.g., 1.0 mm. Where the wax 1104 is coated on the p$^+$-type surface layer 102 under such conditions, a force of, e.g., 7 kgf/cm$^2$ may be applied when the silicon layer 104 is separated from the single-crystal silicon member 101.

The anodizing was carried out first at a low electric current of, e.g., 8 mA/cm$^2$ for 10 minutes and thereafter, raising the level of electric current, an electric current was flowed at, e.g., 32 mA/cm$^2$ for 1 minute. Thus, the porous layer 103 was formed in a layer thickness of, e.g., about 13 μm. Then, after the anodizing was completed, the anti-porous member, wax 1104 provided in square columns was removed with an organic solvent such as xylene. Since the part where the wax 1104 was provided in square columns was not anodized, the unanodized regions 103' were formed.

TABLE 2

| | |
|---|---|
| Anodizing solution: | HF:H$_2$O:C$_2$H$_5$OH = 1:1:1 |
| Current density: | 8 mA/cm$^2$ → 32 mA/cm$^2$ |
| Anodizing time: | 10 min. → (0 sec.) → 1 min. |

Next, on the surface of the porous layer 103 and unanodized regions 103', a silicon layer 104 was formed in a thickness of, e.g., 30 μm by epitaxial growth carried out under conditions shown in Table 3 below, by means of a liquid-phase epitaxy system of a slider type making use of indium as a solvent (FIG. 10C).

Boron was further added in the solvent in a trace quantity (approximately zero-point-few ppm to few ppm based on the weight of silicon dissolved therein) to make the silicon layer 104 into p$^-$-type and also, after the growth was completed, a p$^+$-type layer 205 was further formed on the silicon layer 104 in a thickness of, e.g., 1 μm, using another indium melt having a larger boron content (at least hundreds of ppm based on the weight of silicon dissolved therein) (FIG. 10D).

TABLE 3

| | |
|---|---|
| H$_2$ flow rate: | 5 liter/min |
| Solvent (In) temp.: | 950° C. → 830° C. |
| Slow-cooling rate: | 1° C./min. |

Here, a jig on which the substrate was placed on the surface of the peripheral portion of the single-crystal silicon member 101, and hence that portion was not immersed in the indium solvent. Hence, the silicon layer 104 did not completely cover the porous layer 103 like that shown in FIG. 8 and the porous layer 103 stood uncovered at the surface of the single-crystal silicon member 101.

Accordingly, the single-crystal silicon member 101 with porous layer was set in the anodizing apparatus shown in FIG. 7, in such a way that the silicon layer 104 and p$^+$-type layer 205 faced the negative electrode 1504 in the aqueous HF solution. Then, an electric current was flowed across the positive electrode 307 and the negative electrode 306 in the anodizing solution 302, HF/H$_2$O solution (HF:C$_2$H$_5$OH:H$_2$O=1:1:6) and etching was carried out in an electropolishing mode to remove the whole of the porous layer 103 lying on the peripheral portion of the single-crystal silicon member 101 (FIG. 10E).

Subsequently, on one side of a polymeric film member 206 of, e.g., 50 μm thick, made of polyimide, a silver paste serving as the back electrode 207 was coated in a thickness of, e.g., 10 to 30 μm by screen printing, and this side was brought into close contact with the p$^+$-type layer 205 of the single-crystal silicon member 101 to effect bonding. In this state, these were put in an oven (not shown), where the silver paste was baked under conditions of, e.g., 360° C. for 20 minutes and also the polymeric film member 206 and the single-crystal silicon member 101 were brought into firm bond, holding the layers 103, 104 and so forth between them (FIG. 10F).

Next, against the bonded structure thus obtained, being kept fastened with a vacuum chuck (not shown) on the single-crystal silicon member 101's side not bonded to the film member, force was made to act on one edge of the polymeric film member 206. The flexibility of the polyimide film was utilized and the both were slowly drawn off from the edge of the single-crystal silicon member 101 to effect separation. Thus, the silicon layer 104 and p$^+$-type layer 205 were peeled from the single-crystal silicon member 101 at the part of the porous layer 103 and transferred onto the polymeric film member 206 (FIG. 10G).

A porous layer 103a remaining on the silicon layer 104 peeled from the single-crystal silicon member 101 was selectively etched with a solution of HF/H$_2$O$_2$/H$_2$O mixture with stirring.

The silicon layer 104 and p$^+$-type layer 205 remained on the side of the transferring polymeric film member 206 without being etched and only the porous layer was completely removed. The surface of the silicon layer 104 on this polymeric film member 206 was lightly etched with, e.g., a hydrofluoric acid/nitric acid type etchant to clean it, and thereafter on the silicon layer an n-type μc-Si (microcrystalline silicon) layer as an n$^+$-type layer 208 was deposited in a thickness of, e.g., 200 angstroms by means of a conventional plasma-assisted CVD system under conditions shown in Table 4 below. Here, the μc-Si layer had a dark conductivity of ~5 S/cm.

TABLE 4

| Gas flow rate ratio: | SiH$_4$/H$_2$ = 1 cc/20 cc |
| --- | --- |
| | PH$_3$/SiH$_4$ = 2.0 × 10$^{-3}$ |
| Substrate temperature: | 250° C. |
| Pressure: | 0.5 Torr |
| Discharge power: | 20 W |

Finally, on the μc-Si layer an ITO or the like transparent conductive film 209 and a collector electrode 210 were formed by EB (electron beam) vacuum deposition. Here, the transparent conductive film 209 was formed in a thickness of 82 nm, and the collector electrode 210 was formed of Ti/Pd/Ag in a thickness of 600 nm/200 nm/1 μm, respectively, to make up a solar cell (FIG. 10H).

In regard to the thin-film single-crystal silicon solar cell on polymide thus obtained, its I-V characteristics under irradiation by light of AM1.5 (100 mW/cm$^2$) were measured. As a result, open current voltage was, e.g., 0.58 V, short-circuit photoelectric current was, e.g., 33 mA/cm$^2$ and fill factor was, e.g., 0.79 at a cell area of, e.g., 6 cm$^2$, and an energy conversion efficiency of, e.g., 15.1% was obtained.

A porous layer 103b remaining on the single-crystal silicon member 101 after peeling was also removed by etching in the same manner as the porous layer 103a, and its surface was made smooth (FIG. 10I). Using the single-crystal silicon member 101 thus regenerated, the above steps were repeated to obtain a plurality of thin-film single-crystal solar cells having high-quality silicon layers 104.

EXAMPLE 3

FIGS. 13A to 13H illustrate a flow chart of the production of a semiconductor member in Embodiment 3 of the present invention. A process for producing the semiconductor member of Example 3 is described here with reference to FIGS. 13A to 13H.

Figure 13A:
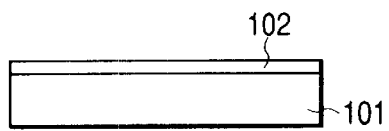
FIGS. 13A, 13B, 13C, 13D, 13E, 13F, 13G and 13H illustrate a flow chart of the production of a semiconductor member in Example 3 of the present invention.

First, to the surface of a single-crystal silicon member 101 of, e.g., 5 inches diameter, boron (B) was thermally diffused using BCl$_3$ as a thermal diffusion source at a temperature of about 1,200° C. to form a p$^+$-type surface layer 102 of about 3 μm thick (FIG. 13A).

Figure 13B:
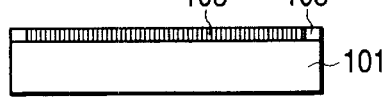

Next, anodizing was carried out by means of the anodizing apparatus shown in FIG. 6, having a member holder 309 which functions as a masking member or an anti-porous member (mask) for shielding the peripheral portion of the single-crystal silicon member 101, using as the anodizing solution 302 an aqueous HF solution and under conditions shown in Table 5 below, to form an unanodized region 103' at the peripheral portion (a region of about 1 to 3 mm from the edge) of the single-crystal silicon member 101 and form a porous layer 103 at the center portion of the single-crystal silicon member 101 (FIG. 13B).

More specifically, the anodizing was carried out first at a low electric current of 5 mA/cm$^2$ for 2.5 minutes and thereafter, slowly raising the level of electric current on, the anodizing was stopped at the time the electric current reached 34 mA/cm$^2$ in 30 seconds.

TABLE 5

| Anodizing solution: | HF:H$_2$O:C$_2$H$_5$OH = 1:1:1 |
| --- | --- |
| Current density: | 5 mA/cm$^2$ → 34 mA/cm$^2$ |
| Anodizing time: | 2.5 min. → (30 sec.) → 0 sec. |

Figure 13C:
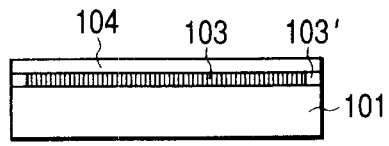

Then, the interior of the porous layer 103 was oxidized in an atmosphere of oxygen under conditions of 400° C. for 1 hour, and the oxide layer at the surface of the porous layer 103 was removed with hydrofluoric acid. Thereafter, on the porous layer 103, a silicon layer 104 was formed by thermal CVD in a thickness of, e.g., 0.5 μm (FIG. 13C). Here, at the peripheral portion of the single-crystal silicon member 101, the porous layer 103 stood covered with the silicon layer 104 like the case shown in FIG. 12.

Figure 13D:
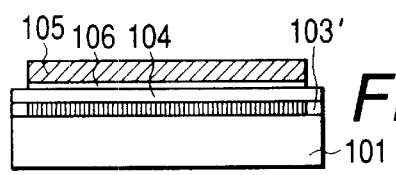

On the surface of the silicon layer 104, an oxide film serving as an adhesive layer 106 was formed in a thickness of about 0.1 μm. Thereafter, a separate support member 105 having a size smaller than the single-crystal silicon member 101 was bonded in close contact to the single-crystal silicon member 101 on its side where the silicon layer 104 was formed, and these were put in a heat-treating furnace (not shown) and heated at, e.g., 1,150° C. to bring the support member 105 and the single-crystal silicon member 101 into firm bond, holding the layers 103 and 104 between them (FIG. 13D).

Figure 13E:
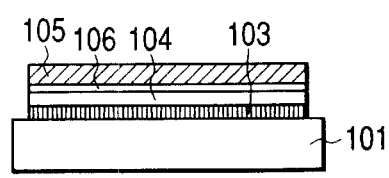
Figure 13F:
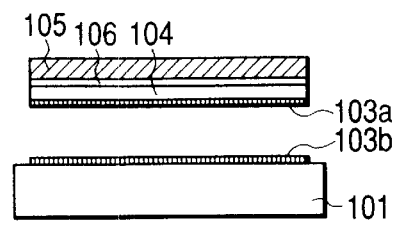

Using the support member 105 as a mask, the silicon layer 104 and unanodized region 103' on the single-crystal silicon member 101 were removed by, e.g., reactive-ion etching to make the edge face of the porous layer 103 uncovered (FIG. 13E). Next, a wedge was inserted (not shown) between the support member 105 and the single-crystal silicon member 101 of the bonded structure to cause the bonded structure to break at the part of the porous layer 103, thus the silicon layer 104 was separated from the single-crystal silicon member 101 (FIG. 13F).

Figure 13G:
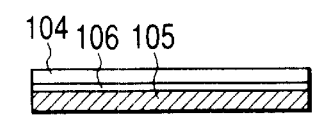

A porous layer 103a remaining on the silicon layer 104 peeled from the single-crystal silicon member 101 was selectively etched with a tetramethylammonium solution of 0.2% concentration with stirring. The silicon layer 104 remained on the support member 105 side without being little etched, and the porous layer 103a was removed. Thus, a semiconductor (SOI) member was obtained (FIG. 13G).

Figure 13H:
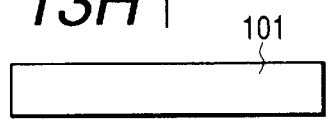

A porous layer 103b remaining on the single-crystal silicon member 101 after peeling was also removed by etching in the same manner as the porous layer 103a, and its surface was made smooth (FIG. 13H). Using the single-crystal silicon member 101 thus regenerated, the above steps were repeated to obtain a plurality of semiconductor (SOI) members having high-quality silicon layers 104.

EXAMPLE 4

A process for producing a solar cell of Example 4 is described here with reference to FIGS. 11A to 11H.

First, into the surface layer of a single-crystal silicon member 101 of, e.g., 8 inches diameter, boron (B) was thermally diffused using $BCl_3$ as a thermal diffusion source at a temperature of about 1,200° C. to form a $p^+$-type surface layer 102 of about 3 μm thick (FIG. 11A).

Next, in the state the single-crystal silicon member 101 was provided with the anti-porous member 304 formed in the manner shown in FIGS. 4A to 4D, the $p^+$-type surface layer 102 was subjected to anodizing by means of the anodizing apparatus shown in FIG. 5, under conditions shown previously in Table 2. Here, an aqueous $HF/C_2H_5OH$ solution was used as the anodizing solution 302. Thus, a porous layer 103 having unanodized regions 103' was formed at the surface of the single-crystal silicon member 101 (FIG. 11B).

Here, in the mask 1102 (FIG. 4A), the openings 1103 having a honeycomb structure were so formed that the wax 1104 was provided in the form of a square column of 30 μm in each side length and the square columns of the wax 1104 were set at intervals of, e.g., 1.0 mm. Also, the anodizing was carried out first at a low electric current of, e.g., 8 mA/cm² for 10 minutes and thereafter, raising the level of electric current, an electric current was flowed at, e.g., 32 mA/cm² for 1 minute.

Thus, the porous layer 103 was formed in a layer thickness of about 13 μm in total. Then, after the anodizing was completed, the anti-porous member wax 1104 provided in square columns was removed with an organic solvent such as xylene. Since the part where the wax 1104 was provided in square columns was not anodized, the unanodized regions 103' were formed.

Next, on the surface of the porous layer 103 and unanodized regions 103', a silicon layer 104 was formed in a thickness of, e.g., 30 μm by epitaxial growth carried out by means of a conventional thermal CVD system under conditions shown in Table 6 below (FIG. 11C). Also, in the course of the epitaxial growth, zero-point-few ppm to few ppm of $B_2H_6$ was added to make the grown silicon layer into $p^-$-type and also, at the final stage of the epitaxial growth, $B_2H_6$ was increased to hundreds of ppm or more to form a $p^+$-type layer 205 in a thickness of 1 μm (FIG. 11D).

TABLE 6

| | |
|---|---|
| Gas flow rate ratio: | $SiH_2Cl_2/H_2$ = 0.5/100 (1/min) |
| Substrate temperature: | 1,050° C. |
| Pressure: | normal pressure |
| Growth time: | 30 min. |

Here, the silicon layer 104 completely covered the porous layer 103 like that shown in FIG. 12.

A SUS stainless steel member serving as a metallic member 606 having a square shape (about 125 mm square) smaller than the diameter of the single-crystal silicon member 101 and having a thickness of, e.g., 0.5 mm was prepared. On one side of the SUS stainless steel member, a silver paste as a metal paste 607 was coated in a thickness of, e.g., 10 to 30 μm by screen printing or the like. This coated side was brought into close contact with the $p^+$-type layer 205 of the single-crystal silicon member 101 to effect bonding.

In this state, these were put in an oven (not shown), where the silver paste was baked under conditions of, e.g., 360° C. for 60 minutes and also the SUS stainless steel member and the single-crystal silicon member 101 were brought into firm bond, holding the layers 103, 104 and so forth between them (FIG. 11E). Using this SUS stainless steel member as a mask, the silicon layer 104, $p^+$-type layer 205 and unanodized region 103' on the single-crystal silicon member 101 were removed by reactive-ion etching to make the edge face of the porous layer 103 uncovered (FIG. 11F).

Next, the SUS stainless steel member and single-crystal silicon member 101 thus bonded (through the layers 103, 104 and so forth) were put in a water bath and energy of ultrasonic wave was applied thereto. The energy of ultrasonic wave was applied at an intensity of, e.g., 25 kHz and 650 W. As a result, the silicon layer 104 was separated from the single-crystal silicon member 101 at the part of the porous layer 103 (FIG. 11G). Thus, the silicon layer 104 and $p^+$-type layer 205 of about 125 mm square in size were peeled from the 8-inch single-crystal silicon member 101 and transferred to the SUS stainless steel member side.

A porous layer 103a remaining on the silicon layer 104 peeled from the single-crystal silicon member 101 was selectively etched with a KOH solution of 0.5% concentration with stirring. On the silicon layer 104 on the SUS stainless steel member, thus obtained, an n-type μc-Si layer as an $n^+$-type layer 208 was deposited in a thickness of, e.g., 600 angstroms by means of a conventional plasma-assisted CVD system (not shown) under conditions shown previously in Table 4. Here, the μc-Si layer had a dark conductivity of ~5 S/cm.

Finally, on the μc-Si layer an ITO or the like transparent conductive film 209 and a collector electrode 210 were formed by EB vacuum deposition. Here, the transparent conductive film 209 was formed in a thickness of 82 nm, and the collector electrode 210 was formed of Ti/Pd/Ag in a thickness of 600 nm/200 nm/1 μm, respectively, to make up a solar cell (FIG. 11H).

In regard to the thin-film single-crystal silicon solar cell on SUS stainless steel member thus obtained, its I-V characteristics under irradiation by light of AM1.5 (100 mW/cm²) were measured. As a result, open-circuit voltage was, e.g., 0.61 V, short-circuit photoelectric current was, e.g., 32 mA/cm² and fill factor was, e.g., 0.79 at a cell area of, e.g., 6 cm², and an energy conversion efficiency of, e.g., 15.4% was obtained.

A porous layer 103b remaining on the single-crystal silicon member 101 after peeling was also removed by etching in the same manner as the porous layer 103a, and its surface was made smooth (FIG. 11I). Using the single-crystal silicon member 101 thus regenerated, the above steps were repeated to obtain a plurality of thin-film single-crystal solar cells having high-quality silicon layers 104.

In Examples 1 to 3, described are processes for making up solar cell construction in which the separation surface of the silicon layer 104 is on the light-incidence side. Conversely, the p-n junction, electrode and so forth may be formed on the side where the growth of the silicon layer 104 has been completed, and a transparent member may be attached onto that side, where the same treatment as that described above may be made to effect separation.

The present invention has specifically been described above by giving Examples. The present invention is by no means construed limitative by the foregoing Examples, and is modifiable in variety. For example, masking materials may previously be attached to the both sides of the single-crystal silicon member 101, where the porous layer 103 may be formed on one side of that member at the time of anodizing and thereafter the member may be turned over, thus the porous layer 103 can readily likewise be formed also on the other side. Accordingly, for example, the step shown in FIG. 1C and its subsequent steps may be carried out on the both sides of the single-crystal silicon member 101 so that semiconductor member and solar cell can be obtained double at one time, bringing about an improvement in mass productivity.

In addition, the foregoing description concerns the case in which the silicon layer 104 is separated from the single-crystal silicon member 101 at the part of the porous layer 103, but a brittle portion may be formed in the interior of the single-crystal silicon member 101 by implanting, e.g., H ions or He ions in the single-crystal silicon member 101 to make heat treatment, and the separation may be made at this portion. Stated specifically, a masking material may previously be attached to the surface of the single-crystal silicon member 101, where H ions are implanted into its surface portion under conditions of, e.g., 20 keV and $5 \times 10^{16}$ cm$^{-2}$ to form a brittle layer in a depth of 0.1 μm from the surface of the single-crystal silicon member 101, and the silicon layer 104 is formed thereon by thermal CVD in the same manner as in, e.g., Example 1. Thereafter, the subsequent steps may be followed up likewise, thus the silicon layer 104 can be separated from the single-crystal silicon member 101 at the part of the brittle layer.

The respective embodiments of the present invention have been described taking the case in which the p$^+$-type surface layer 102 is formed at the surface of the single-crystal silicon member 101.

Alternatively, a p$^+$-type layer 102 formed at the surface of an epitaxial layer grown on the single-crystal silicon member 101, or a p$^+$-type single-crystal silicon member 101 itself may, be made porous at its surface portion to form the porous layer 103 and unanodized regions 103'.

As having been described above, the present invention has made it possible to obtain in a good efficiency semiconductor members and thin-film crystal solar cells having good characteristics. This has made it possible to provide in the market semiconductor members and solar cells having mass productivity and good quality.

What is claimed is:

1. A process for producing a semiconductor member, comprising:
   a first step of forming a porous layer by making porous a first member prepared or an epitaxial layer formed at the surface of the first member, leaving some region or regions thereof not made porous;
   a second step of bonding a semiconductor layer formed on the porous layer and on the first member or epitaxial layer that is left not made porous, to a second member to form a bonded structure; and
   a third step of separating the bonded structure in the part of the porous layer, at the interface between the porous layer and the first member or at the interface between the porous layer and the semiconductor layer to transfer the semiconductor layer to the second member side,
   wherein the first member or epitaxial layer is made porous leaving some region or regions thereof not made porous so that the porous layer does not cause any separation in the part of the porous layer, at the interface between the porous layer and the first member or at the interface between the porous layer and the semiconductor layer in the first and second steps.

2. The process for producing a semiconductor member according to claim 1, wherein the first member from which the semiconductor layer has been separated in the third step is smoothed on its surface and thereafter again prepared as the first member in the first step.

3. The process for producing a semiconductor member according to claim 1, wherein in the first step the first member or the epitaxial layer is anodized to form the porous layer.

4. The process for producing a semiconductor member according to claim 3, wherein the first member or the epitaxial layer is anodized in the state the region or regions to be left not made porous is/are covered, to form the porous layer.

5. The process for producing a semiconductor member according to claim 4, wherein the first member or the epitaxial layer is anodized in the state the region or regions to be left not made porous is/are covered with an anti-porous member provided by coating an anti-porous material through a mask or by applying an anti-porous mask.

6. The process for producing a semiconductor member according to claim 5, wherein the anti-porous material comprises a wax, an epoxy resin or a fluorine resin.

7. The process for producing a semiconductor member according to claim 5, wherein the anti-porous member is provided at the peripheral portion of the first member or epitaxial layer to form the region to be left not made porous.

8. The process for producing a semiconductor member according to claim 5, wherein the anti-porous member is provided at a plurality of positions of the first member or epitaxial layer to form the regions to be left not made porous.

9. The process for producing a semiconductor member according to claim 5, wherein the mask and the anti-porous mask comprise a material resistant to hydrofluoric acid.

10. The process for producing a semiconductor member according to claim 3, wherein the porous layer is formed by anodizing carried out first at a low electric current and thereafter at a high electric current.

11. The process for producing a semiconductor member according to claim 1, wherein the first member is a sheetlike member, and the epitaxial layer, the porous layer and the semiconductor layer are formed on the both sides of the first member.

12. The process for producing a semiconductor member according to claim 8, wherein the regions to be left not made porous are arranged in a polygon.

13. The process for producing a semiconductor member according to claim 1, wherein the semiconductor layer has a semiconductor junction formed therein.

14. The process for producing a semiconductor member according to claim 1, wherein the semiconductor layer comprises a photoelectric conversion layer.

15. A process for producing a solar cell, comprising the steps of producing a semiconductor member by the process according to claim 14, and providing the semiconductor member with an electrode.

* * * * *